United States Patent
Bekku

(10) Patent No.: US 8,378,486 B2
(45) Date of Patent: Feb. 19, 2013

(54) SEMICONDUCTOR DEVICE AND METHOD OF MANUFACTURING SEMICONDUCTOR DEVICE

(75) Inventor: Fumihiro Bekku, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 162 days.

(21) Appl. No.: 12/923,885

(22) Filed: Oct. 13, 2010

(65) Prior Publication Data
US 2011/0095420 A1    Apr. 28, 2011

(30) Foreign Application Priority Data
Oct. 27, 2009    (JP) .................. 2009-246813

(51) Int. Cl.
  *H01L 23/48*    (2006.01)
(52) U.S. Cl. ........................ 257/737; 438/613
(58) Field of Classification Search .......... 257/737, 257/E23.021, E21.575; 438/613, 614
See application file for complete search history.

(56) References Cited

U.S. PATENT DOCUMENTS

| 4,813,129 A * | 3/1989 | Karnezos .................. 29/832 |
| 2006/0237842 A1* | 10/2006 | Shindo .................. 257/737 |
| 2006/0288572 A1* | 12/2006 | Tanaka et al. ............ 29/846 |

FOREIGN PATENT DOCUMENTS

JP    2007-201106 A    8/2007

* cited by examiner

*Primary Examiner* — Shaun Campbell
(74) *Attorney, Agent, or Firm* — McGinn IP Law Group, PLLC

(57) ABSTRACT

A semiconductor device includes a protective insulating film, an opening formed in the protective insulating film, an electrode pad located within the opening, a bump formed on the protective insulating film, and an interconnect. The bump includes a bump core and a conductive film. The bump core includes an insulating resin layer and a conductive resin layer located on the insulating resin layer. The conductive film is formed on at least the upper surface of the bump core. The interconnect connects the conductive film of the bump and the electrode pad.

20 Claims, 8 Drawing Sheets

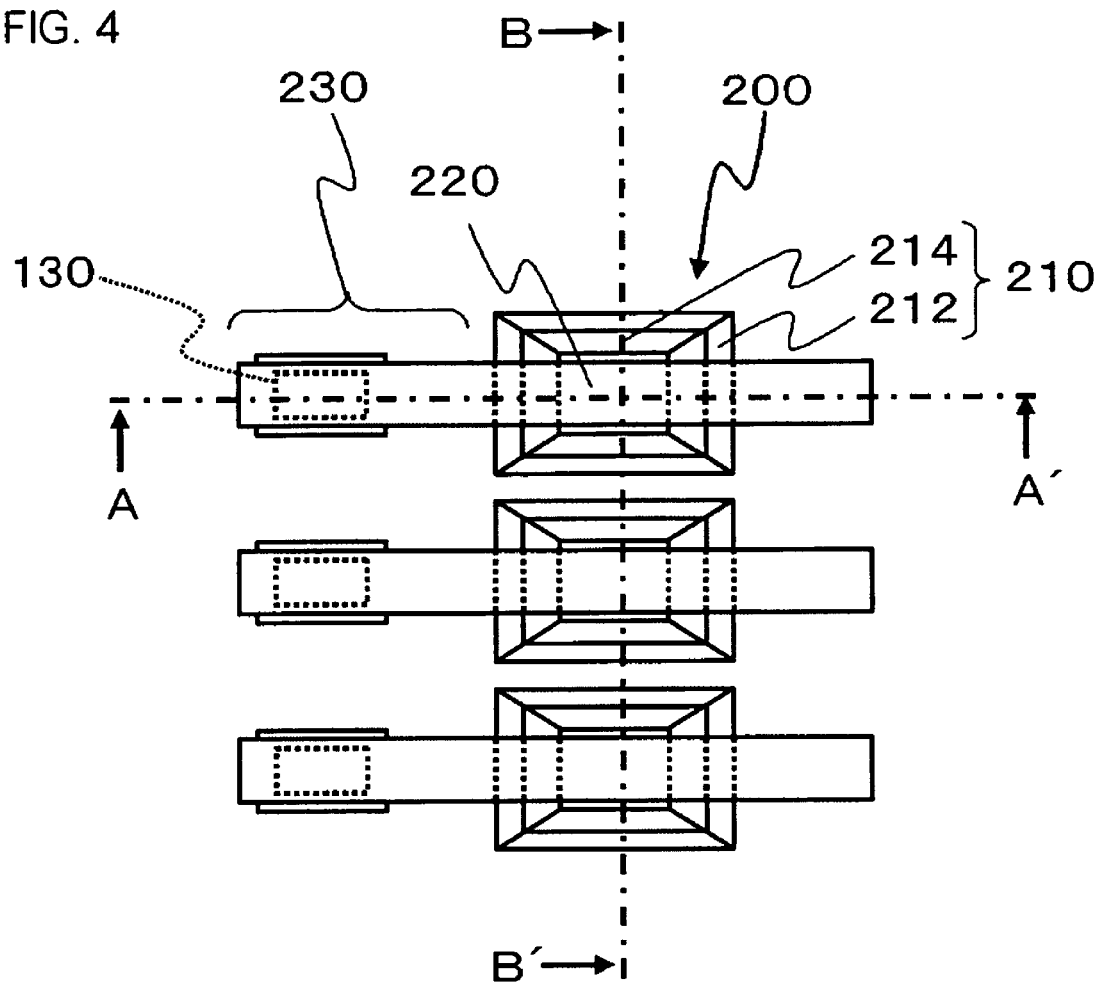

ically. For this reason, even when a crack exists in the conductive film, electrical reliability of the bump is secured by a portion formed by the conductive resin layer in the bump core. In addition, even when the lower portions of the bump core of the adjacent bumps are formed to be connected to each other, the lower portions of the bump core are formed by the insulating resin layer, which results in suppression of electrical short-circuit

SEMICONDUCTOR DEVICE AND METHOD OF MANUFACTURING SEMICONDUCTOR DEVICE

This application is based on Japanese patent application No. 2009-246813, the content of which is incorporated hereinto by reference.

BACKGROUND

1. Technical Field

The present invention relates to a semiconductor device having a bump in which a conductive film is formed on a bump core made of resin and a method of manufacturing the semiconductor device.

2. Related Art

A bump is formed in a semiconductor device in order to mount a semiconductor device on the mounting board. A circuit included in the semiconductor device is connected to an electrode such as the land of the mounting board through this bump. In recent years, a technique has been developed in which the core of the bump is formed of a resin, and the bump is formed by forming a conductive film on this core.

For example, Japanese Unexamined patent publication NO. 2007-201106 discloses a technique for dispersing conductive metal particles in a resin forming the bump core. According to this technique, it has been known that even when a crack or a fissure is generated in a conductive film, it is possible to suppress lowering of the reliability of the electrical connection between the bump and the electrode.

With the technique disclosed in Japanese Unexamined Patent Publication No. 2007-201106, the conductive metal particles are dispersed throughout the whole bump core. On the other hand, there may be a case where when the bumps are brought into close contact with each other, the lower portions of the bump core are connected to each other. In such a case, when the conductive metal particles are dispersed throughout the whole bump core, the bumps adjacent to each other are short-circuited through the bump core.

SUMMARY

In one embodiment, there is provided a semiconductor device including: a protective insulating film; an opening formed in the protective insulating film; an electrode pad located within the opening; a bump, formed over the protective insulating film, that includes a bump core and a conductive film formed over the bump core; and an interconnect that connects the conductive film of the bump and the electrode pad, wherein the bump core includes an insulating resin layer, and a conductive resin layer located over the insulating resin layer.

A place in which a crack is generated in the conductive film forming the bump is a portion located on the upper portion of the bump core, for example, a portion located at a region of the boundary between the upper surface and the side of the bump core. According to the invention, the bump core has a configuration in which the conductive resin layer is laminated on the insulating resin layer. That is, the upper portion of the bump core is formed by the conductive resin layer. For this reason, even when a crack exists in the conductive film, electrical reliability of the bump is secured by a portion formed by the conductive resin layer in the bump core. In addition, even when the lower portions of the bump core of the adjacent bumps are formed to be connected to each other, the lower portions of the bump core are formed by the insulating resin layer, which results in suppression of electrical short-circuit of the adjacent bumps. Therefore, according to the invention, it is possible to make the bump pitch narrower without short-circuiting between the adjacent bumps, while suppressing lowering of the electrical reliability of the bump.

In another embodiment, there is provided a method of manufacturing a semiconductor device, including forming a bump in a substrate including a protective insulating film, an opening formed in the protective insulating film, and an electrode pad exposed from the opening, the method including: forming an insulating resin layer over the protective insulating film; forming a conductive resin layer over the insulating resin layer; forming a bump core by selectively removing a laminated film of the insulating resin layer and the conductive resin layer; and forming the bump and an interconnect that connects the bump to the electrode pad by selectively forming a conductive film over the bump core, the protective insulating film, and the electrode pad.

According to the invention, in the semiconductor device having the bump with the bump core, it is possible to make the bump pitch narrower without short-circuiting between the adjacent bumps, while suppressing lowering of the electrical reliability of the bump.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 4 is a plan view of the semiconductor device shown in FIG. 3A;

DETAILED DESCRIPTION

Figure 1A:
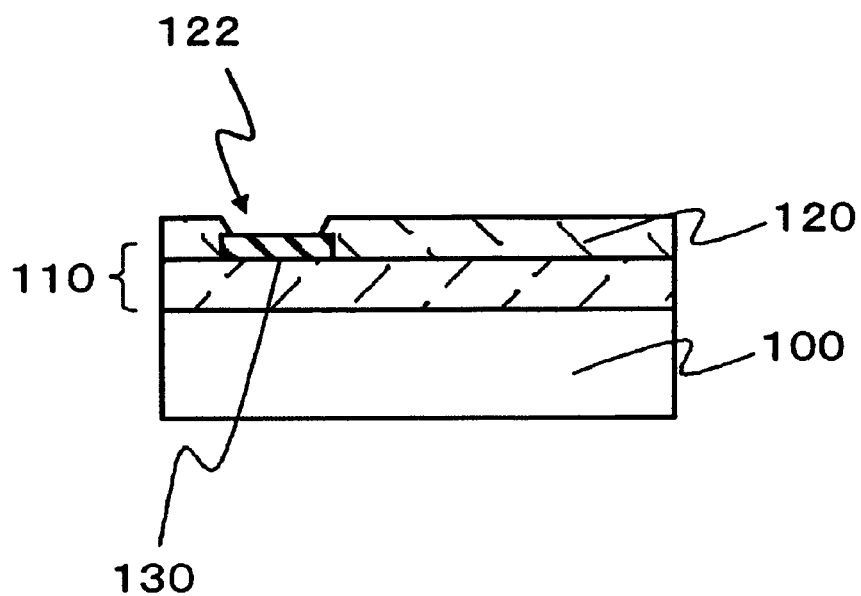
FIGS. 1A and 1B are cross-sectional views illustrating a method of manufacturing a semiconductor device according to a first embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, the embodiment of the invention will be described with reference to the accompanying drawings. In all the drawings, like elements are referenced by like reference numerals and descriptions thereof will not be repeated.

FIG. 1A to FIG. 3B are cross-sectional views illustrating a method of manufacturing a semiconductor device according to a first embodiment. The method of manufacturing the semiconductor device includes a process of forming a bump in a substrate 100 having a protective insulating film 120, an opening 122 formed in the protective insulating film 120, and an electrode pad 130 exposed from the opening 122. Specifically, first, an insulating resin layer 212 is formed on the protective insulating film 120. Next, a conductive resin layer 214 is formed on the insulating resin layer 212. Next, a bump core 210 is formed by selectively removing the laminated film of the insulating resin layer 212 and the conductive resin layer 214. Next, a bump 200 and an interconnect 230 are formed by selectively forming a conductive film on the bump core 210, the protective insulating film 120, and the electrode pad 130. The' interconnect 230 connects the bump 200 to the electrode pad 130. Hereinafter, detailed descriptions will be given.

First, as shown in FIG. 1A, elements (not shown), such as a transistor, are formed on the substrate 100, and a multilayered interconnect layer 110 is further formed on the substrate 100. The electrode pad 130 is formed in an interconnect layer located at the uppermost layer of the multilayered interconnect layer 110. Next, the protective insulating film 120 is formed on the multilayered interconnect layer 110. Next, the opening 122 is formed by selectively removing the protective insulating film 120. The opening 122 is located on the electrode pad 130, and exposes the electrode pad 130 from the protective insulating film 120.

Figure 1B:
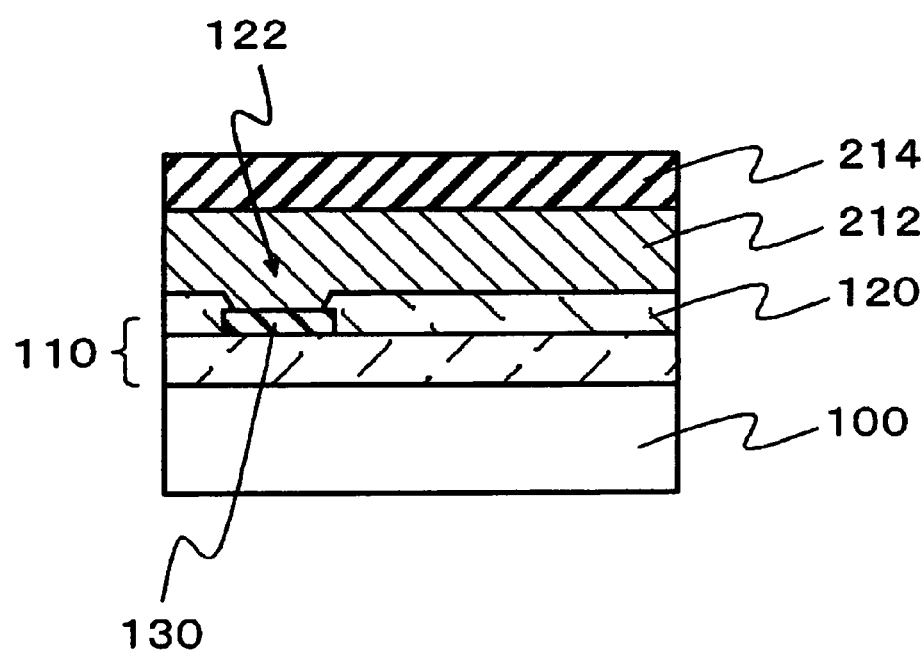

Next, as shown in FIG. 1B, the insulating resin layer 212 is formed on the protective insulating film 120 and the electrode pad 130. The insulating resin layer 212 is formed of, for example, a thermosetting resin such as a phenol resin, an epoxy resin, a polyimide resin, an amino resin, an unsaturated polyester resin, a silicon resin, or an allyl resin, or a photo-curable resin such as a silicone-based resin or an imide-based resin.

Next, the conductive resin layer 214 is formed on the insulating resin layer 212. The conductive resin layer 214 has a configuration in which conductive powder, for example, particles are mixed in an insulating base material. The base material of the conductive resin layer 214 is, for example, a thermosetting resin such as a phenol resin, an epoxy resin, a polyimide resin, an amino resin, an unsaturated polyester resin, a silicon resin, or an allyl resin, or a photo-curable resin such a silicone-based resin or an imide-based resin. It is preferable that the base material of the conductive resin layer 214 is the same resin as the resin forming the insulating resin layer 212.

Figure 2A:
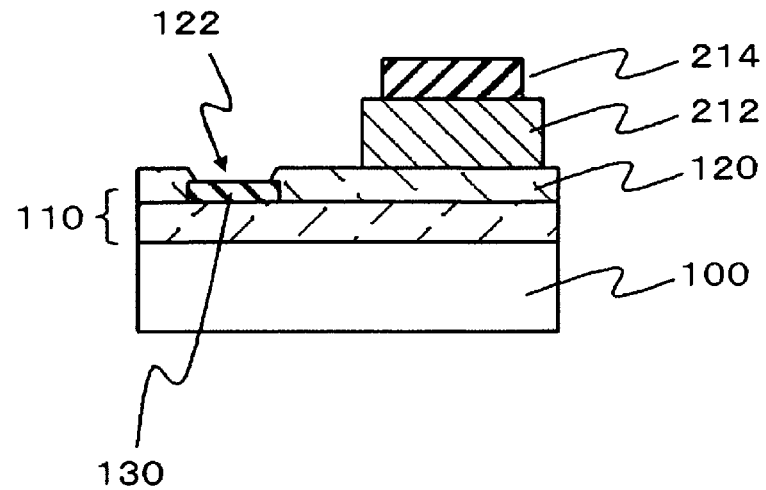
FIGS. 2A and 2B are cross-sectional views illustrating the method of manufacturing the semiconductor device according to the first embodiment.

Next, as shown in FIG. 2A, the insulating resin layer 212 and the conductive resin layer 214 are exposed and developed. Thereby, the insulating resin layer 212 and the conductive resin layer 214 are selectively removed, and remain on the protective insulating film 120 in an island shape.

Meanwhile, the conductive resin layer 214 has a configuration in which conductive powder, for example, metallic powder are mixed in a photosensitive resin. As shown in FIG. 2A, in the state after selective removal thereof, the area of the conductive resin layer 214, when seen in a plan view, is made smaller than that of the insulating resin layer 212. In order to obtain such a configuration, there is a method of, for example', adjusting the type and quantity of a photosensitizing agent, a solvent, and an additive agent of the resin of each layer. When the area of the conductive resin layer 214 is made smaller than that of the insulating resin layer 212, it is possible to improve coatability of the conductive film with respect to the bump core 210 at the time of forming a conductive film 220 described later. However, the area of the conductive resin layer 214 may be the same as the area of the insulating resin layer 212.

Figure 2B:
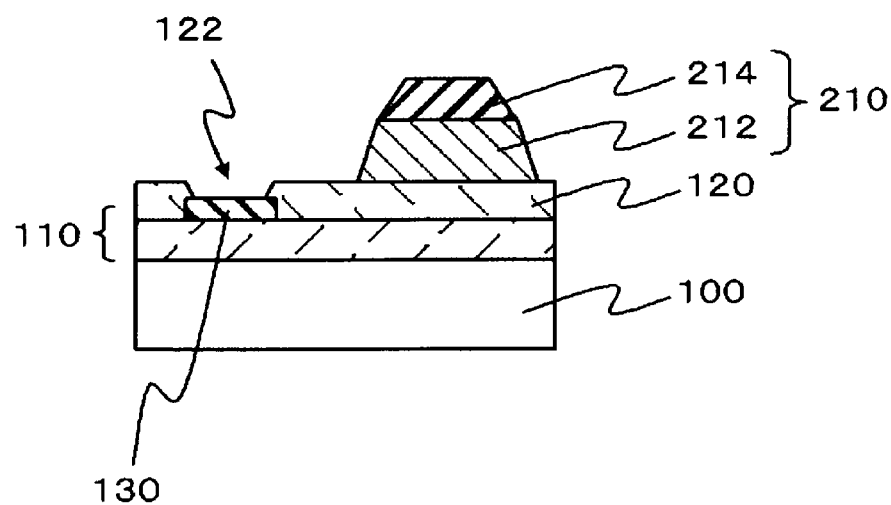

Next, as shown in FIG. 2B, the insulating resin layer 212 and the conductive resin layer 214 are cured. This process is a process of heat-treating the insulating resin layer 212 and the conductive resin layer 214 when the insulating resin layer 212 and the conductive resin layer 214 are thermosetting resins, and a process of irradiating the insulating resin layer 212 and the conductive resin layer 214 with light when the insulating resin layer 212 and the conductive resin layer 214 are photo-curable resins. Thereby, the bump core 210 is formed on the protective insulating film 120. The bump core 210 is formed by the insulating resin layer 212 and the conductive resin layer 214.

In the meantime, it is possible to make the side of the insulating resin layer 212 steeper than the side of the conductive resin layer 214 in the bump core 210 by adjusting the manufacturing conditions.

Figure 3A:
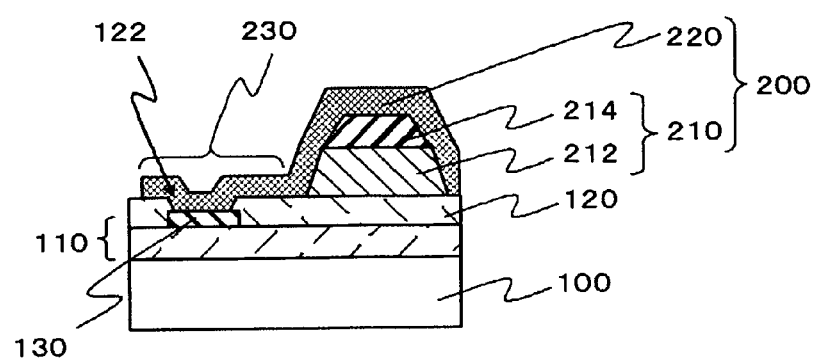
FIGS. 3A and 3B are cross-sectional views illustrating the method of manufacturing the semiconductor device according to the first embodiment.

Next, as shown in FIG. 3A, a conductive film, for example, an Au film is formed on the bump core 210, the protective insulating film 120, and the electrode pad 130 by, for example, a sputtering method. Next, a resist pattern (not shown) is formed on the conductive film, and the conductive film is etched using this resist pattern as a mask. Thereby, the conductive film is selectively removed, and the conductive film 220 for forming the bump 200, and the interconnect 230 are formed. The bump 200 has a configuration in which the conductive film 220 is formed on the bump core 210. The interconnect 230 is stretched from the conductive film 220 of the bump 200 onto the protective insulating film 120, and connects the conductive film 220 of the bump 200 to the electrode pad 130. After that, the resist pattern is removed.

The semiconductor device thus formed includes the protective insulating film 120, the opening 122 formed in the protective insulating film 120, the electrode pad 130 located within the opening 122, the bump 200 formed on the protective insulating film 120, and the interconnect 230. The bump 200 includes the bump core 210 and the conductive film 220. The bump core 210 includes the insulating resin layer 212, and the conductive resin layer 214 located on the insulating resin layer 212. The conductive film 220 is formed on at least the upper surface of the bump core 210. The interconnect 230 connects the conductive film 220 of the bump 200 and the electrode pad 130.

In this state, it is preferable that the thickness of the conductive resin layer 214 is equal to or greater than the thickness of the conductive film 220. In addition, it is preferable that the thickness of the conductive resin layer 214 is equal to or less than 90% of the height $h_1$ (see FIG. 5) of the bump core 210. These reasons will be described.

There is a high possibility that cracks may be generated in the conductive film 220 under the vertex portion of the bump 200, because of pressing at the time of mounting and stress due to the resin deformation which follows. In order to effectively compensate for cracks generated at the time of mounting, it is preferable that the thickness of the conductive resin layer 214 is at least the thickness of the conductive film 220 in the vicinity of the vertex portion of the bump 200.

In addition, in consideration of avoidance of a short circuit of the bumps 200 adjacent to each other due to swelling of the bump core 210 at time of mounting, it is preferable that the thickness of the conductive resin layer 214 is equal to or less than 90% of the height $h_1$ of the bump core 210. Meanwhile, there may be a case where it is necessary to make the thickness of the conductive resin layer 214 smaller, for example, to set the thickness thereof to be equal to or less than 50% of the height $h_1$ of the bump core 210, due to the swelling characteristics of the resin or the mounting pressure.

Figure 3B:
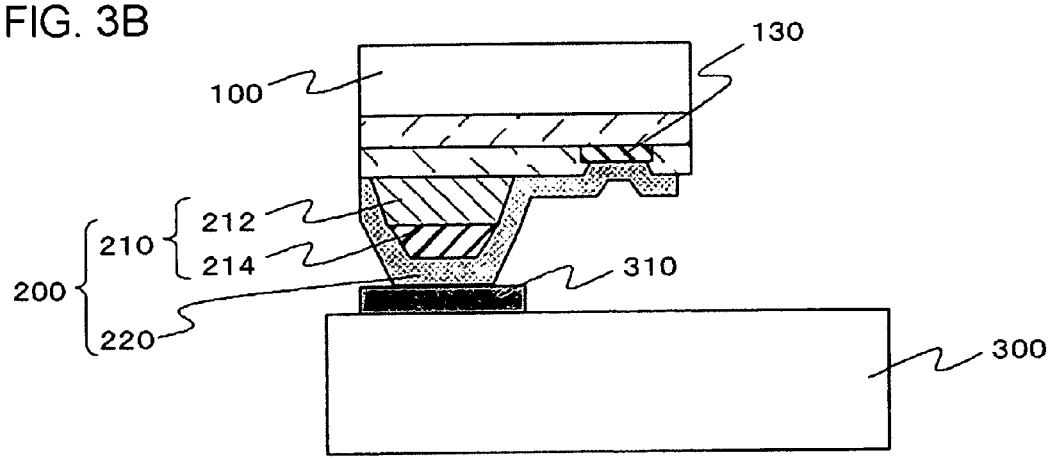

After that, as shown in FIG. 3B, chip on glass (COG) mounting or chip on film (COF) mounting of the semiconductor device in a mounting board 300 is performed. When the semiconductor device is a liquid crystal driver, the mounting board 300 is a glass substrate. In this state, the bump 200 of the semiconductor device is connected to an electrode 310 of the mounting board 300. The electrode 310 is, for example a land, but is not limited to the land.

Figure 5:
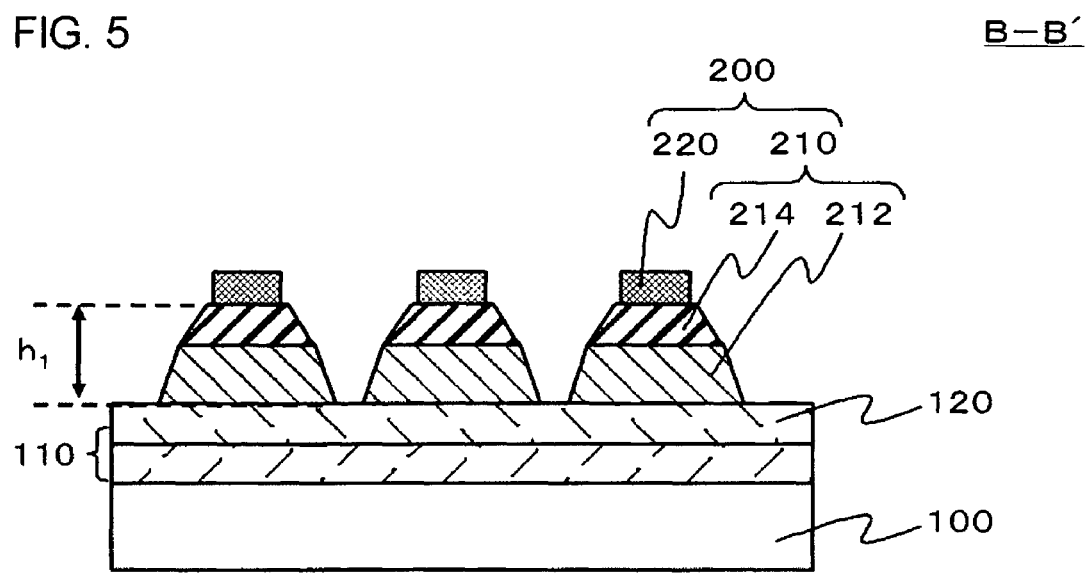
FIG. 5 is a cross-sectional view taken along the line B-B' in FIG. 4.

FIG. 4 is a plan view of the semiconductor device shown in FIG. 3A, and FIG. 5 is a cross-sectional view taken along the line B-B' in FIG. 4. Meanwhile, FIG. 3A is a cross-sectional view taken along the line A-A' in FIG. 4. As shown in FIGS. 4 and 5, a plurality of bumps 200 is disposed along a first direction (vertical direction in the drawings). The interconnect 230 is stretched in a second direction different from the first direction, for example, a direction (horizontal direction in the drawings) perpendicular to the first direction. A plurality of bumps 200 is separated from each other, but is disposed close to each other. In addition, the conductive film 220 of the bump 200 is not formed in a portion directed in the above-mentioned first direction among the sides of the bump core 210. However, the conductive film 220 may be formed in a region which is formed by the conductive resin layer 214 among these sides.

Figure 6:
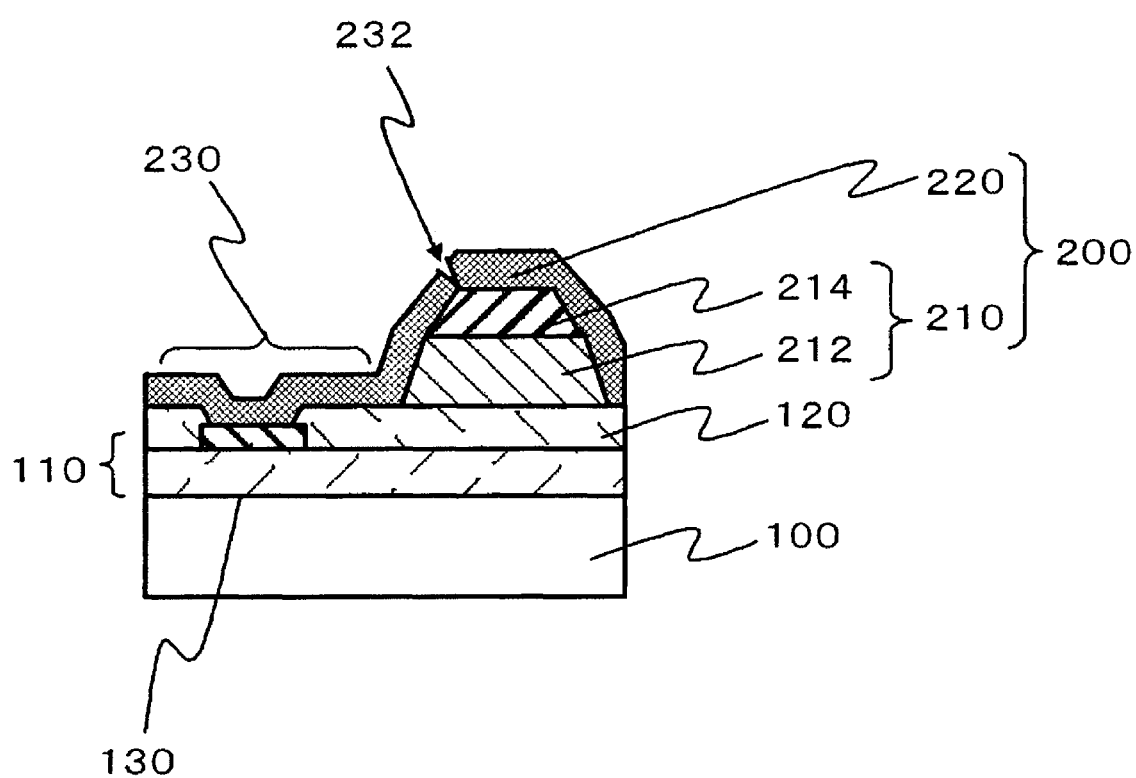
FIG. 6 is a diagram for explaining the operation and the effect of the first embodiment.

Next, the operation and the effect of the embodiment will be described with reference to FIG. 6. When the semiconductor device shown in FIGS. 3A and 3B is mounted, a crack 232 is easily generated at a portion located on the upper portion of the bump core 210, for example, a portion located in a region of a boundary between the upper surface and the side of the bump core 210, in the conductive film 220 forming the bump 200. On the other hand, in the embodiment, the upper portion of the bump core 210 is formed by the conductive resin layer 214. For this reason, even when the crack 232 is generated in the conductive film 220, a portion located in the upper surface of the bump core 210 in the conductive film 220 and the interconnect 230 are electrically connected to each other through the conductive resin layer 214. Therefore, electrical reliability of the bump 200 is not lowered.

In addition, the lower portion of the bump core 210 is formed by the insulating resin layer 212. For this reason, even when a plurality of bumps 200 is disposed close to each other, and the adjacent bump cores 210 are connected to each other at the lower portion at the time of forming the bump core 210, electrical conduction between the bumps 200 adjacent to each other through the bump cores 210 is suppressed.

In addition, when a resin used as a base material of the conductive resin layer 214 is the same as that of the insulating resin layer 212, simultaneous exposure can be performed using one mask, thereby allowing the suppression of an increase in the manufacturing cost of the semiconductor device.

Figure 7:
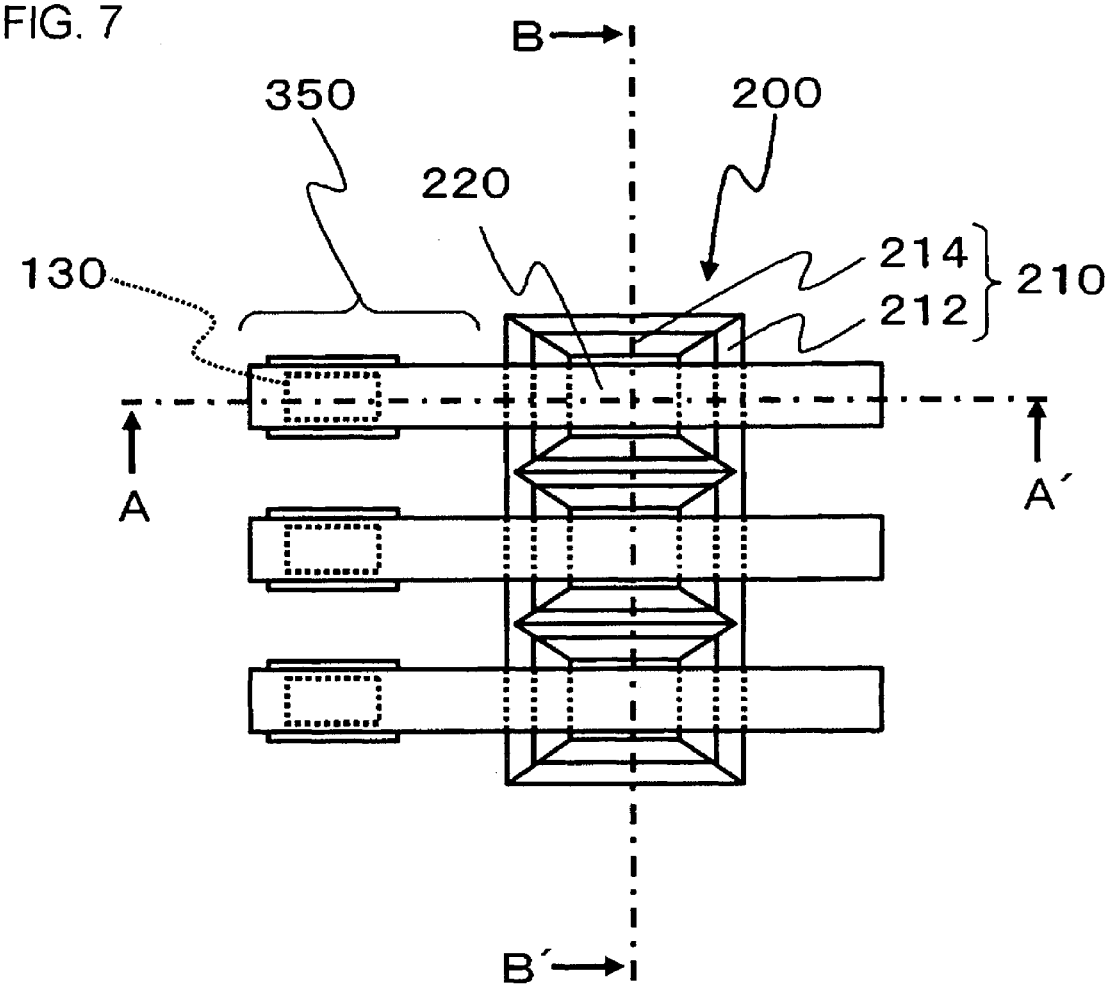
FIG. 7 is a plan view illustrating the configuration of the semiconductor device according to a second embodiment.
Figure 8:
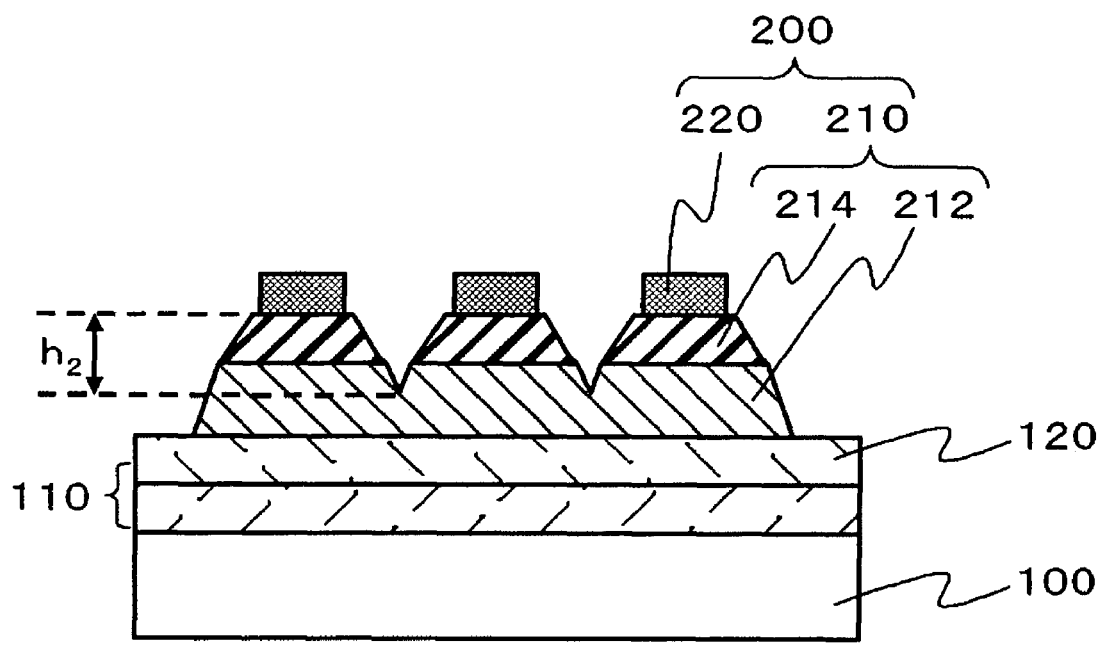
FIG. 8 is a cross-sectional view taken along the line B-B' in FIG. 7.

FIG. 7 is a plan view illustrating the configuration of the semiconductor device according to a second embodiment, and FIG. 8 is a cross-sectional view taken along the B-B' in FIG. 7. The cross section of the line A-A' in FIG. 7 is the same as that shown in FIGS. 3A and 3B in the first embodiment.

The semiconductor device according to the embodiment is the same as the semiconductor device according to the first embodiment, with the exception that a plurality of bumps 200 is close to each other, and at least the lower portions of the insulating resin layer 212 of the bump core 210 are connected to each other. In addition, a method of manufacturing this semiconductor device is the same as that of the first embodiment.

In the embodiment, the thickness of the conductive resin layer 214 is equal to or greater than the thickness of the conductive film 220. In addition, it is preferable that the thickness of the conductive resin layer 214 is equal to or less than 90% of the height $h_2$ of the vertex portion of the bump core 210 based on the segregation point of the adjacent bump cores 210.

In the embodiment, it is also possible to obtain the same effect as that of the first embodiment. In addition, since a plurality of bump 200 can be disposed closer to each other, the semiconductor device can be made smaller.

As described above, although the embodiments of the invention have been set forth with reference to the drawings, they are merely illustrative of the invention, and various configurations other than those stated above can be adopted.

It is apparent that the present invention is not limited to the above embodiments, but may be modified and changed without departing from the scope and spirit of the invention.

What is claimed is:
1. A semiconductor device, comprising:
a protective insulating film;
an opening formed in said protective insulating film;
an electrode pad located within said opening;
a bump, formed over said protective insulating film that includes a bump core and a conductive film formed over said bump core; and
an interconnect that connects said conductive film of said bump and said electrode pad,
wherein said bump core includes an insulating resin layer, and a conductive resin layer located over said insulating resin layer, and
wherein a lowermost surface of the conductive resin layer is disposed above a top surface of the insulating resin layer.
2. The semiconductor device as set forth in claim 1, wherein said bump comprises a plurality of bumps disposed along a first direction,
wherein said interconnect is stretched from said bump to a second direction, different from said first direction, and
wherein said plurality of bumps is constituted such that at least lower portions of said insulating resin layer forming said bump core are connected to each other.
3. The semiconductor device as set forth in claim 1, wherein said conductive resin layer includes a conductivity by mixing a conductive powder in an insulating resin.
4. The semiconductor device as set forth in claim 3, wherein said insulating resin forming said conductive resin layer is a same as a resin forming said insulating resin layer.
5. A method of manufacturing a semiconductor device including a bump on a substrate, the bump including a protective insulating film, an opening being formed in said protective insulating film, and an electrode pad exposed from said opening, said method comprising:
forming an insulating resin layer over said protective insulating film;
forming a conductive resin layer over said insulating resin layer such that a lowermost surface of the conductive resin layer is disposed above a top surface of the insulating resin layer;
forming a bump core by selectively removing a laminated film of said insulating resin layer and said conductive resin layer; and
forming said bump and an interconnect that connects said bump to said electrode pad by selectively forming a conductive film over said bump core, said protective insulating film, and said electrode pad.
6. The method of manufacturing the semiconductor device as set forth in claim 5, wherein said insulating resin layer and said conductive resin layer have a photosensitivity, and wherein said forming the bump core includes exposing and developing said laminated film in accordance with said photosensitivity.

7. The method of manufacturing the semiconductor device as set forth in claim 6, wherein said conductive resin layer has a conductivity obtained by mixing a conductive powder in an insulating and photosensitive resin for forming said insulating resin layer.

8. The semiconductor device as set forth in claim 1, wherein the top surface of the insulating resin layer comprises an uppermost surface of the insulating resin layer.

9. The semiconductor device as set forth in claim 1, wherein, in a plan view, an area of the conductive resin layer is less than an area of the insulating resin layer.

10. The semiconductor device as set forth in claim 1, wherein a side of the insulating resin layer is steeper than a side of the conductive resin layer.

11. The semiconductor device as set forth in claim 1, wherein a thickness of the conductive resin layer is equal to or greater than a thickness of the conductive film.

12. The method of manufacturing the semiconductor device as set forth in claim 5, wherein the top surface of the insulating resin layer comprises an uppermost surface of the insulating resin layer.

13. The method of manufacturing the semiconductor device as set forth in claim 5, wherein, in a plan view, an area of the conductive resin layer is less than an area of the insulating resin layer.

14. The method of manufacturing the semiconductor device as set forth in claim 5, wherein a side of the insulating resin layer is steeper than a side of the conductive resin layer.

15. The method of manufacturing the semiconductor device as set forth in claim 5, wherein a thickness of the conductive resin layer is equal to or greater than a thickness of the conductive film.

16. The method of manufacturing the semiconductor device as set forth in claim 5, wherein a resin forming said conductive resin layer is the same as a resin forming said insulating resin layer.

17. A semiconductor device, comprising:
a protective insulating film;
an electrode pad located in said protective insulating film;
an insulating resin layer disposed on said protective insulating film;
a conductive resin layer disposed on said insulating resin layer;
a conductive film disposed on said conductive resin layer; and
an interconnect that connects said conductive film with said electrode pad,
wherein a lowermost surface of the conductive resin layer is disposed above a top surface of the insulating resin layer.

18. The semiconductor device as set forth in claim 17, wherein the top surface of the insulating resin layer comprises an uppermost surface of the insulating resin layer.

19. The semiconductor device as set forth in claim 17, wherein, in a plan view, an area of the conductive resin layer is less than an area of the insulating resin layer, and
wherein a side of the insulating resin layer is steeper than a side of the conductive resin layer.

20. The semiconductor device as set forth in claim 17, wherein a resin forming said conductive resin layer is the same as a resin forming said insulating resin layer.

* * * * *